(12) United States Patent
Oishi

(10) Patent No.: US 7,855,601 B2
(45) Date of Patent: Dec. 21, 2010

(54) SEMICONDUCTOR DEVICE

(75) Inventor: Kazuaki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 53 days.

(21) Appl. No.: 12/404,448

(22) Filed: Mar. 16, 2009

(65) Prior Publication Data

US 2009/0302947 A1 Dec. 10, 2009

(30) Foreign Application Priority Data

Jun. 5, 2008 (JP) .............................. 2008-148195

(51) Int. Cl.
*H03G 3/30* (2006.01)
(52) U.S. Cl. ..................... 330/285; 330/279; 330/296
(58) Field of Classification Search .................. 330/254, 330/257, 261, 278, 285, 288, 296
See application file for complete search history.

(56) References Cited

U.S. PATENT DOCUMENTS 6,144,233 A    11/2000   Maruyama et al.
6,252,458 B1    6/2001   Shibata
7,629,853 B2 * 12/2009   Oishi .......................... 330/311
2007/0038912 A1  2/2007  Hashimoto et al.

FOREIGN PATENT DOCUMENTS

JP    2000-174568    6/2000
JP    2000-269757    9/2000
JP    2000-278053    10/2000

* cited by examiner

*Primary Examiner*—Khanh V Nguyen
(74) *Attorney, Agent, or Firm*—Katten Muchin Rosenman LLP

(57) ABSTRACT

A semiconductor device including: a gain control circuit; a first circuit which is controlled a gain to be constant by the gain control circuit; and a bias circuit connected to the first circuit, wherein the first circuit including a first transistor; and a load resistance, an amplification factor or an attenuation factor of the first circuit is proportionate to a product of a transconductance of the first transistor and a resistance value of the load resistance, and a voltage applied to the load resistance is set as an output of the semiconductor device, the bias circuit generates and outputs a differential current of a current that is proportionate to a drain current flowing into the first transistor and a current that is inversely proportionate to the load resistance value, and an output of the bias circuit is connected to an output node of the first circuit.

5 Claims, 7 Drawing Sheets

Output DC Voltage [VDD-V(out)]

| | Prior Art (Not Applied) | | |
|---|---|---|---|
| MIN | TYP | MAX | |
| 0.27 | 0.64 | 1.69 | V |
| (-58%) | - | (+164%) | |

FIG.5A

| | Present Invention | | |
|---|---|---|---|
| MIN | TYP | MAX | |
| 0.57 | 0.61 | 0.63 | V |
| (-6.6%) | - | (+3.2%) | |

SEMICONDUCTOR DEVICE

CROSS-REFERENCE TO RELATED APPLICATION

This application is based upon and claims the benefit of priority of the prior Japanese Patent Application No. 2008-148195, filed on Jun. 5, 2008, the entire contents of which are incorporated herein by reference.

FIELD

The embodiment(s) discussed herein is (are) related to a semiconductor device.

BACKGROUND

Various bias circuits are known in the prior art (see Japanese Laid-open Patent Publication 2000-174568, Japanese Laid-open Patent Publication 2000-278053, and so on, for example).

FIG. 6 depicts a constitutional example of an amplifier circuit 100 and a Gm compensation bias circuit 120 according to the prior art. A gain of the amplifier circuit 100 is expressed as a product (R×Gm) of a resistance value R of a resistor 101 and a transconductance (mutual conductance) Gm of a transistor 102.

However, the resistor 101 and the transistor 102 are different elements, and since the transconductance Gm and the resistance R are not mutually related, they are affected independently by manufacturing conditions and temperature variation. As a result, in the case of not using the GM compensation circuit, the gain of the amplifier circuit 100 is not stable.

Hence, a Gm compensation bias circuit 120 outputs a Gm compensation bias voltage to the transistor 100 such that the transconductance Gm is inversely proportionate to the resistance R (Gm∝1/R), whereby the gain of the amplifier circuit 100 can be made constant (R×Gm∝R×1/R=constant).

Here, an output direct current voltage (DC voltage) output from an output terminal OUT of the amplifier circuit 100 can be expressed by $$Vdd - R \times Igm \quad \text{(Equation 1)},$$

where Vdd is a power supply voltage and Igm is a drain current flowing into the transistor 102.

However, even when the gain of the amplifier circuit 100 can be made constant by the Gm compensation bias circuit 120, if the drain current Igm varies, the output direct current voltage of the amplifier circuit 100 varies greatly, as depicted in Equation 1. The drain current Igm is a current at which the transconductance of the transistor 102 is inversely proportionate to the resistance value, and this current is affected greatly by the physical characteristics of the transistor 102 as well as manufacturing and temperature variation, causing it to vary irrespective of the resistance value. FIG. 7 depicts an example of the manner in which the output direct current voltage varies greatly (indicated by broken lines in the drawing).

As a result of this large variation in the output voltage of the amplifier circuit 100, a distortion characteristic (compression characteristic) of an output signal deteriorates. For example, when the output current voltage is close to the power supply voltage, the output signal is limited by the power supply voltage, and when the output current voltage is close to the ground, the output signal is limited by the ground potential.

SUMMARY

According to an aspect of the invention, A semiconductor device including: a gain control circuit; a first circuit which is controlled a gain to be constant by the gain control circuit; and a bias circuit connected to the first circuit, wherein the first circuit including a first transistor; and a load resistance, an amplification factor or an attenuation factor of the first circuit is proportionate to a product of a transconductance of the first transistor and a resistance value of the load resistance, and a voltage applied to the load resistance is set as an output of the semiconductor device, the bias circuit generates and outputs a differential current of a current that is proportionate to a drain current flowing into the first transistor and a current that is inversely proportionate to the load resistance value, and an output of the bias circuit is connected to an output node of the first circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIGS. 5A and 5B depict examples of simulation results;

DESCRIPTION OF EMBODIMENT(S)

Embodiments of the present invention will be described below with reference to the drawings.

First Embodiment

Figure 1:
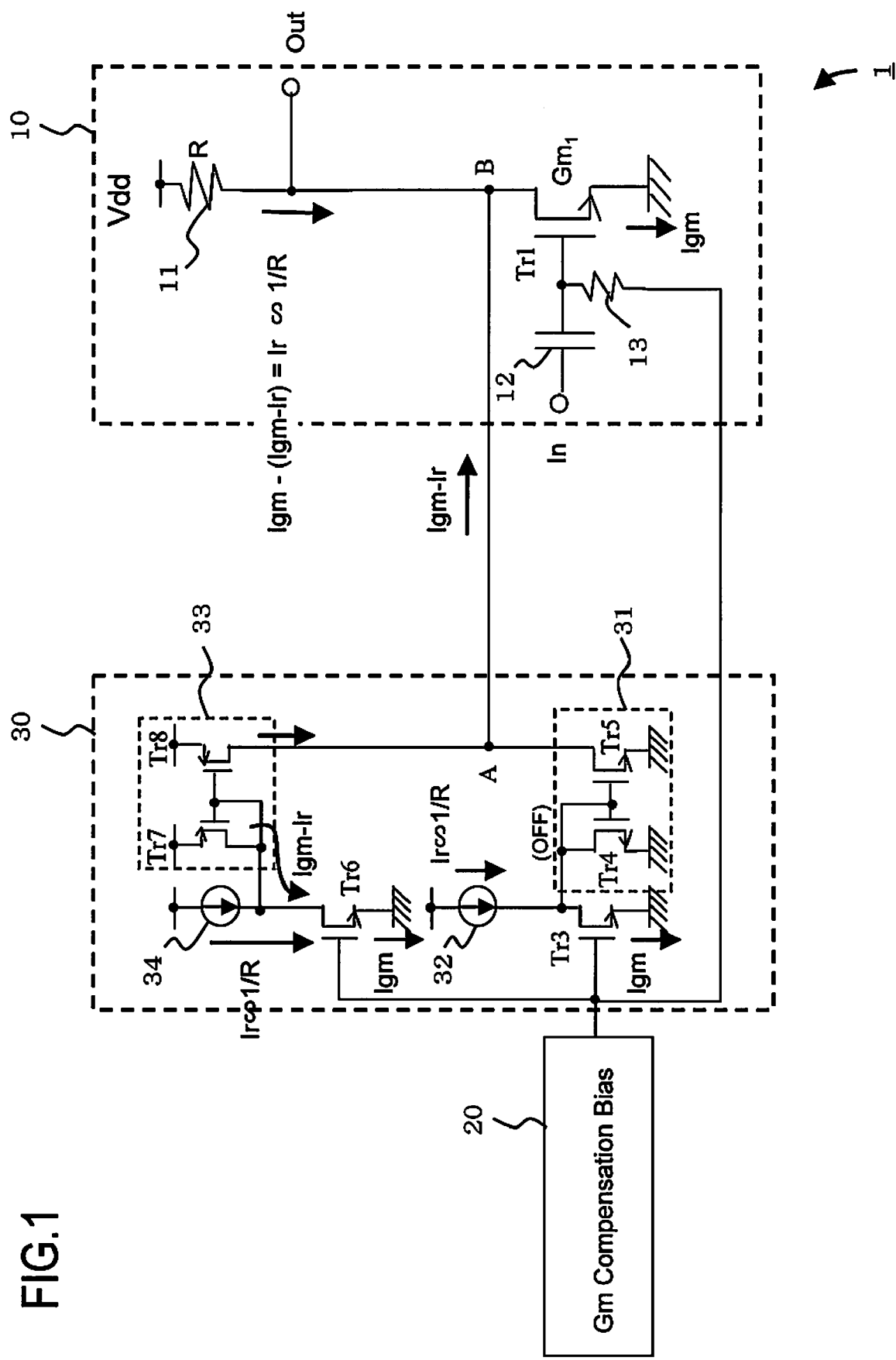
FIG. 1 depicts constitutional examples of an output voltage bias circuit and an amplifier circuit.

First, a first embodiment will be described. FIG. 1 depicts a constitutional example of a semiconductor device 1 according to the first embodiment. The semiconductor device 1 includes an amplifier circuit 10, a Gm compensation bias circuit 20, and an output direct current voltage stabilization bias circuit ("stabilization bias circuit" hereafter) 30.

As depicted in FIG. 1, the amplifier circuit 10 includes a resistor 11 (having a resistance value R), a capacitor 12, a resistor 13, and a transistor Tr1 (transconductance $Gm_1$).

The amplifier circuit 10 amplifies a signal input from an IN terminal and outputs the amplified signal from an OUT terminal. In the amplifier circuit 10, one end of the resistor 11 is connected to a power supply voltage Vdd and the other end is connected to a drain of the transistor Tr1. A source of the transistor Tr1 is grounded, and a Gm compensation bias voltage from the Gm compensation bias circuit 20 is applied to a gate. The OUT terminal is connected between the resistor 11 and the transistor Tr1.

The stabilization bias circuit 30 is used to reduce variation in an output direct current voltage output from the OUT terminal of the amplifier circuit 10 and suppress deterioration of a distortion characteristic (compression characteristic) of the output signal. The stabilization bias circuit 30 includes current mirror circuits 31, 33, current sources 32, 34, and transistors Tr3, Tr6.

The current mirror circuit 31 includes two n-channel MOS transistors Tr4, Tr5. The sources of the two transistors Tr4, Tr5 are both grounded, while the gates are connected to each other. A drain of the transistor Tr4 is connected to the gate and also connected between the current source 32 and the transistor Tr3.

The gates of the transistors Tr3, Tr6 are both connected to the Gm compensation bias circuit 20, whereby a Gm compensation bias is applied to the transistors Tr3, Tr6 and a drain current Igm flows thereto. Further, the drains of the transistors Tr3, Tr6 are connected respectively to the current sources 32, 34. The sources of the transistors Tr3, Tr6 are both grounded.

The current sources 32, 34 output a current Ir ($\propto 1/R$) that is inversely proportional to the resistance value R of the resistor 11 of the amplifier circuit 10. As long as the current sources 32, 34 can output the current Ir, they may be constituted by transistors.

The current mirror circuit 33 includes two p-channel MOS transistors Tr7, Tr8. The gates of the transistors Tr7, Tr8 are connected to each other. Further, the gate of the transistor Tr7 is connected to the drain, and an output thereof is connected between the drain of the transistor Tr6 and the current source 34. The drain of the transistor Tr8 is connected to the drain of the transistor Tr5 of the current mirror circuit 31.

The Gm compensation bias circuit (gain control circuit) 20 applies to the transistor Tr1 a bias voltage at which a transconductance Gm of the transistor Tr1 in the amplifier circuit 10 becomes inversely proportionate (Gm $\propto 1/R$) to the resistance value R of the resistor 11. As a result, the gain of the amplifier 10 becomes constant relative to manufacturing conditions and temperature variation. Any circuit that can realize this function may be used as the Gm compensation bias circuit 20, and a known circuit configuration may be employed.

Next, an operation will be described. The following description will be divided into a case in which Igm>Ir and a case in which Igm<Ir.

When Igm>Ir, the following operation is performed. The current source 34 outputs the current Ir that is inversely proportionate to the resistance value R of the resistor 11. Meanwhile, the drain current Igm is caused to flow into the transistor Tr6 by the Gm compensation bias circuit 20. As a result, a differential current (Igm−Ir) flows into the transistor Tr6 from the current mirror circuit 33.

Meanwhile, the drain current Igm is caused to flow into the transistor Tr3 by the Gm compensation bias circuit 20. Further, the current Ir flows through the current source 32. Since Igm>Ir, the current Ir output from the current source 32 flows entirely to the transistor Tr3 side and does not flow into the current mirror circuit 31. As a result, the current mirror circuit 31 switches OFF.

Hence, the current (Igm−Ir) from the current mirror circuit 33 is output from a connection point A of the stabilization bias circuit 30. This differential current (Igm−Ir) serves as an output current (differential current) of the stabilization bias circuit 30.

When the output current (Igm−Ir) flows into a connection point B (output node) of the amplifier circuit 10, the drain current Igm is caused to flow into the transistor Tr1 by the Gm compensation bias circuit 20. As a result, a current of Igm−(Igm−Ir)=Ir flows into the resistor 11.

Here, the current Ir flowing through the resistor 11 is inversely proportionate to the resistance value R of the resistor 11 and constant in relation to manufacturing conditions and temperature variation. Accordingly, the output direct current voltage from the OUT terminal corresponds to R×Ir=constant, and therefore the output DC voltage is stable.

Further, the current Igm at which the transconductance Gm becomes constant is caused to flow into the transistor Tr1 of the amplifier circuit 10 by the Gm compensation bias voltage from the Gm compensation bias circuit 20. Hence, the gain of the amplifier circuit 10 is constant.

Therefore, by having the stabilization bias circuit 30 cause the output current (Igm−Ir) to flow into the amplifier circuit 10 while the Gm compensation bias circuit 20 keeps the gain of the amplifier circuit 10 constant, the output DC voltage can be stabilized. Hence, even when a bias voltage that compensates for the transconductance Gm is applied by the Gm compensation bias circuit 20, the output characteristic of the amplifier circuit 10 does not deteriorate.

When Igm<Ir, on the other hand, the following operation is performed. Since Igm<Ir, the output current Ir of the current source 34 flows entirely to the transistor Tr6 side such that the current mirror circuit 33 switches OFF. Further, the current Ir and the current Igm flow into the current source 32 and the transistor Tr3, respectively, and therefore a differential current (Igm−Ir) flows into the current mirror circuit 31. As a result, the current (Igm−Ir) flows from the connection point A. In this case, a similar operation to that of the case in which Igm>Ir is performed. Hence, similarly to the case in which Igm>Ir, even when the Gm compensation bias voltage that compensates for the transconductance Gm of the transistor Tr1 in the amplifier circuit 10 is applied to the amplifier circuit 10, variation in the output direct current voltage of the amplifier circuit 10 is small, and therefore a favorable distortion characteristic is obtained in the output signal.

Second Embodiment

Figure 2:
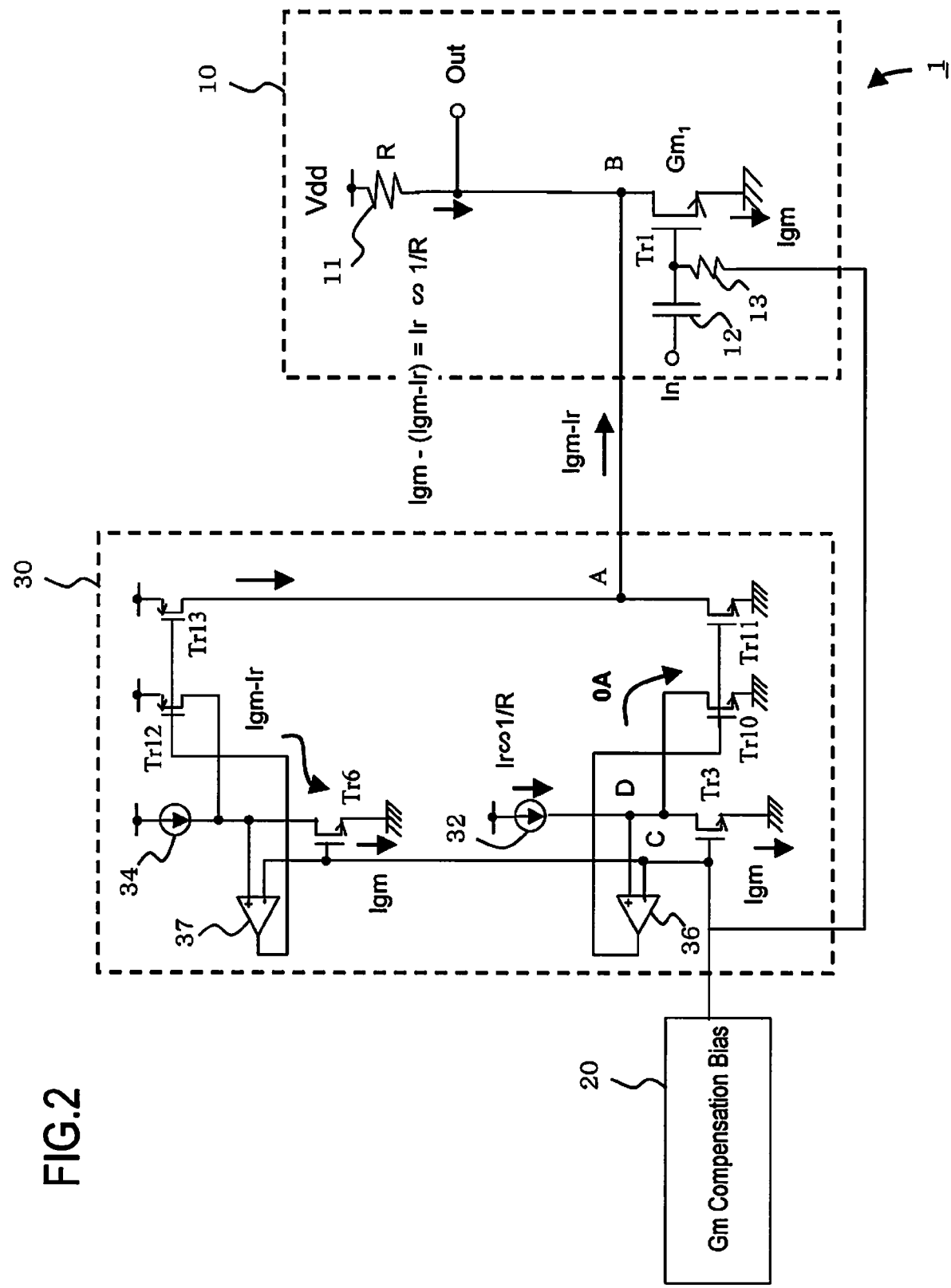
FIG. 2 depicts another constitutional example of the output voltage bias circuit.

Next, a second embodiment will be described. FIG. 2 depicts a constitutional example of the semiconductor device 1 according to the second embodiment. Here, the stabilization bias circuit 30 further includes operation amplifiers 36, 37 and transistors Tr10 to Tr13.

The Gm compensation bias circuit 20 is connected to the gate of the transistor Tr3 and to one of the inputs of the operation amplifier 36.

The drain of the transistor Tr3 is connected to the current source 32 from which the current Ir ($\propto 1/R$) flows and the other input of the operation amplifier 36, and is also connected to the drain of the n-channel MOS transistor Tr10. The output of the operation amplifier 36 is fed back to the gate of the transistor Tr10.

Further, the n-channel MOS transistor Tr11, which includes an identical gate/source voltage to the transistor Tr10, is connected to the transistor Tr10.

Meanwhile, the gate of the transistor Tr6 is connected to the Gm compensation bias circuit 20 and one of the inputs of the operation amplifier 37. The drain of the transistor Tr6 is connected to the current source 34 and the other input of the operation amplifier 37. The output of the operation amplifier 37 is fed back to the gate of the p-channel transistor Tr12. Further, the transistor Tr13, which has an identical gate and source voltage to the transistor Tr12, is connected to the transistor Tr12.

The drains of the transistors Tr11, Tr13 are connected to each other such that the stabilization bias circuit 30 outputs a differential current (output current) from the connection point A.

Next, an operation will be described. When Igm>Ir, the current source 34 outputs the current Ir ($\propto 1/R$) and the drain current Igm flows into the transistor Tr6, and therefore, the differential current (Igm−Ir) flows to the drain side of the transistor Tr12.

Meanwhile, the current source 32 outputs the current Ir and the current Igm flows into the transistor Tr3, but since a relationship of Igm>Ir is established, the current from the current source 32 flows entirely to the transistor Tr3 side and no current flows into the drain of the transistor Tr10.

Hence, the current (Igm−Ir) is output from the drain of the transistor Tr13, and this current serves as the output current of the stabilization bias circuit 30. Therefore, similarly to the first embodiment, even when the Gm compensation bias that compensates for the transconductance Gm of the transistor Tr1 in the amplifier circuit 10 is applied to the amplifier circuit 10, variation in the output current voltage of the amplifier circuit 10 is small, and as a result, a favorable output signal distortion characteristic is obtained.

When Igm<Ir, no current flows into the drain of the transistor Tr12 and the current (Igm−Ir) flows into the drain of the transistor Tr10, similarly to the first embodiment. Hence, similarly to the first embodiment, the characteristic of the output DC voltage of the amplifier circuit 10 does not deteriorate.

The operation amplifiers 36, 37 are used in the second embodiment. Therefore, the voltages of connection points C, D on the input side of the operation amplifier 36, for example, are made identical by a virtual short between the operation amplifiers 36, 37.

More specifically, the GM compensation bias voltage is applied to one of the inputs of the operation amplifier 36 by the Gm compensation bias circuit 20. Hence, due to a virtual short, the other input of the operation amplifier 36 is set at an identical Gm compensation bias voltage to the one of inputs, whereby stability is achieved. As a result, drain current deviation (Igm+α) due to variation in the drain voltage, which is caused by an output resistance rds of the transistor Tr3, does not occur in the drain current Igm flowing through the transistor Tr3. Accordingly, the accuracy of the output current (Igm−Ir) from the stabilization bias circuit 30 improves. The same can be said with regard to the operation amplifier 37 side. Therefore, a further improvement in the accuracy of the output direct current voltage of the amplifier circuit 10 is achieved.

Third Embodiment

Figure 3:
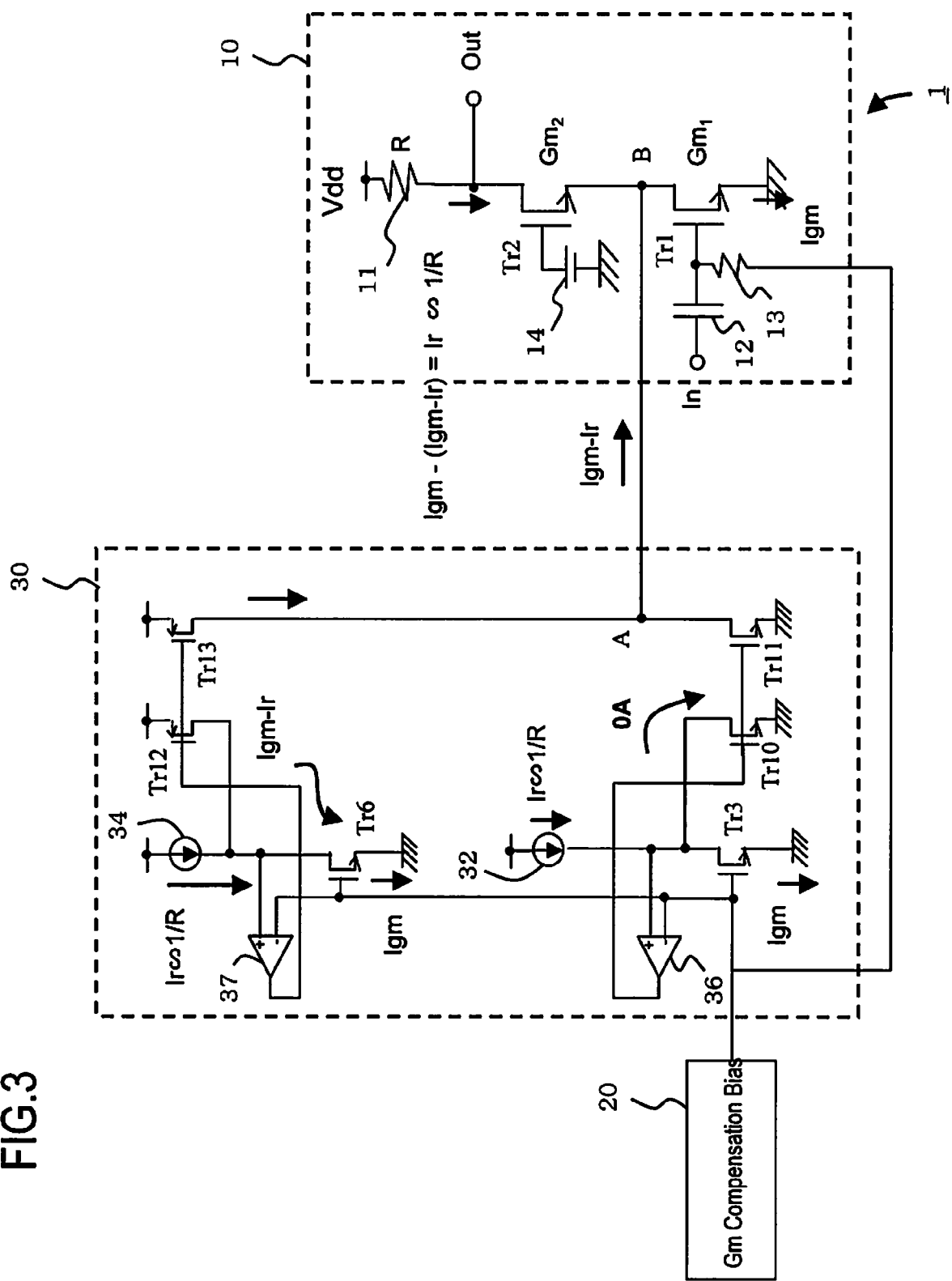
FIG. 3 depicts another constitutional example of the amplifier circuit.

Next, a third embodiment will be described. FIG. 3 depicts a constitutional example of the semiconductor device 1 according to the third embodiment. The amplifier circuit 10 further includes a transistor Tr2.

The transistor Tr2 is connected in cascade form between the resistor 11 and the transistor Tr1. More specifically, the drain of the transistor Tr2 is connected to the resistor 11, and the source of the transistor Tr2 is connected to the drain of the transistor Tr1. The OUT terminal is connected between the resistor 11 and the transistor Tr2, and the stabilization bias circuit 30 is connected between the transistors Tr1, Tr2.

Even when the two transistors Tr1, Tr2 are connected by wiring, they are typically unlikely to be affected by parasitic capacitance. On the connection line (between the connection points A and B) to which the stabilization bias circuit 30 is connected, on the other hand, a large amount of parasitic capacitance exists due to the wiring, and it is therefore preferable to connect the transistors Tr1, Tr2, which are unlikely to be affected by parasitic capacitance.

Note that the differential current (Igm−Ir) is output from the connection line, similarly to the first embodiment and so on. Therefore, implementation can be performed in a similar manner to the first embodiment and so on.

Further, an example in which two transistors are connected in cascade form is described in the third embodiment, but three, four, or more transistors may be connected in cascade form as long as the connection line is connected between the transistors connected in cascade form.

Fourth Embodiment

Figure 4:
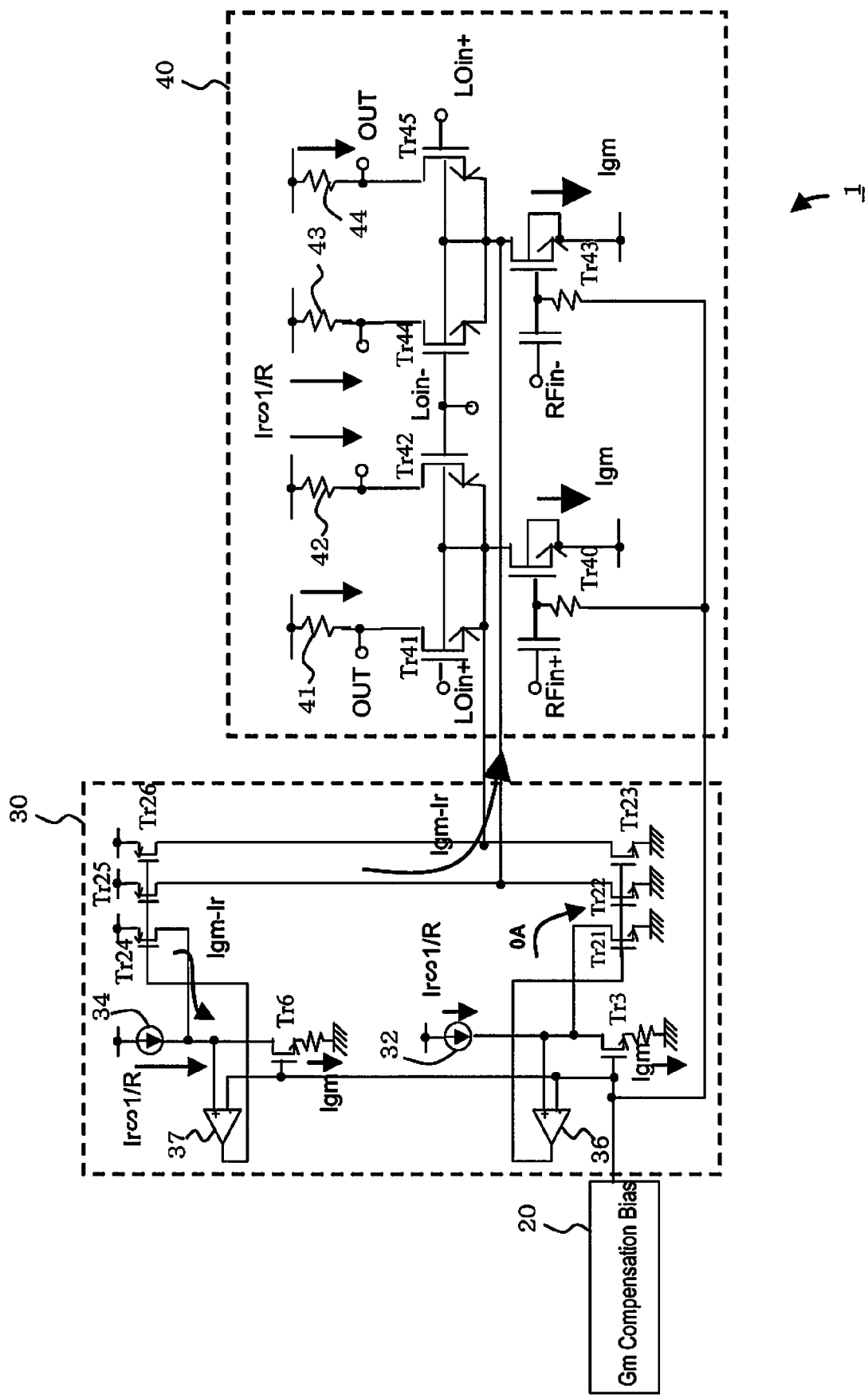
FIG. 4 depicts constitutional examples of the output voltage bias circuit and a mixer circuit.
Figure 6:
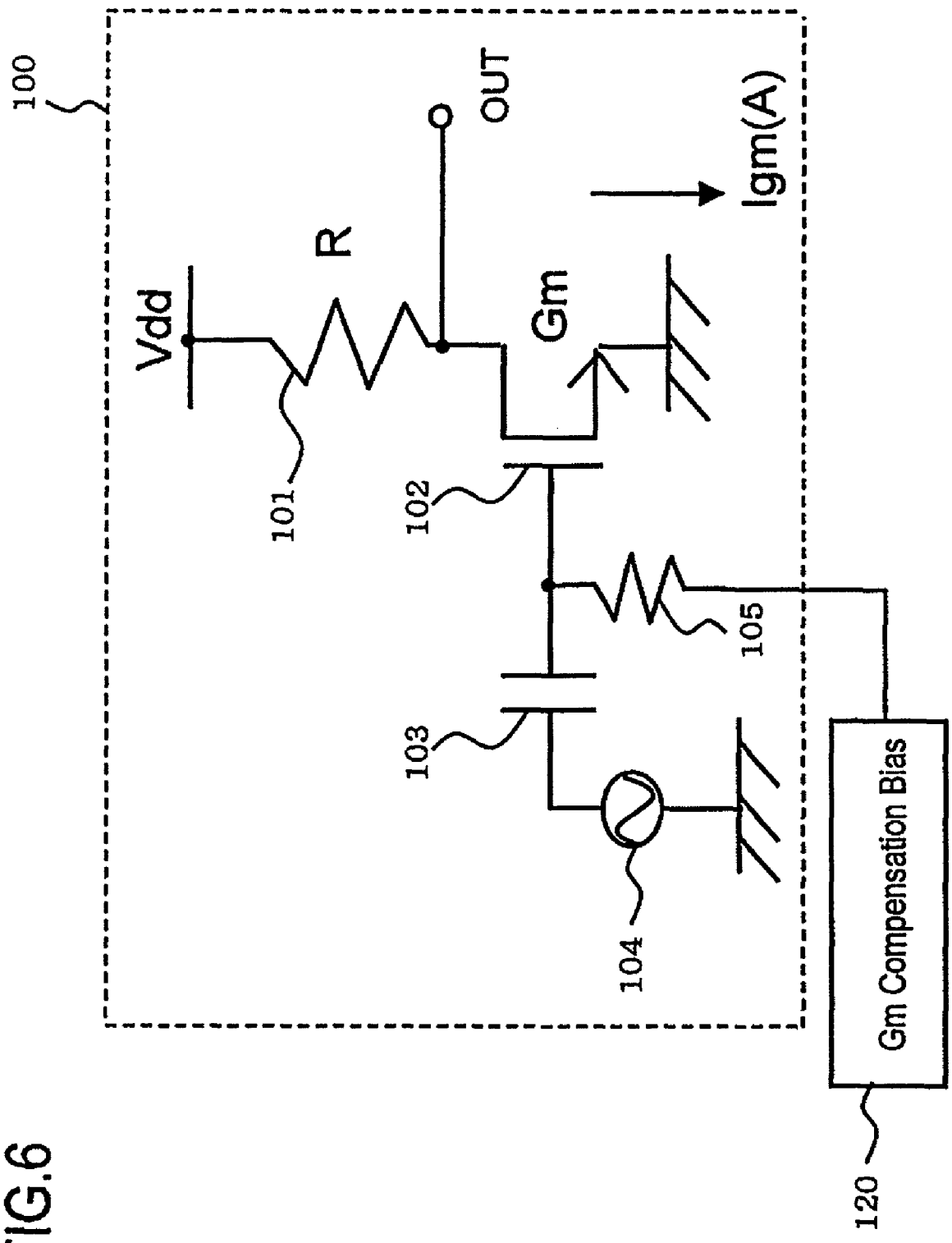
FIG. 6 depicts a constitutional example of a conventional amplifier circuit.
Figure 7:
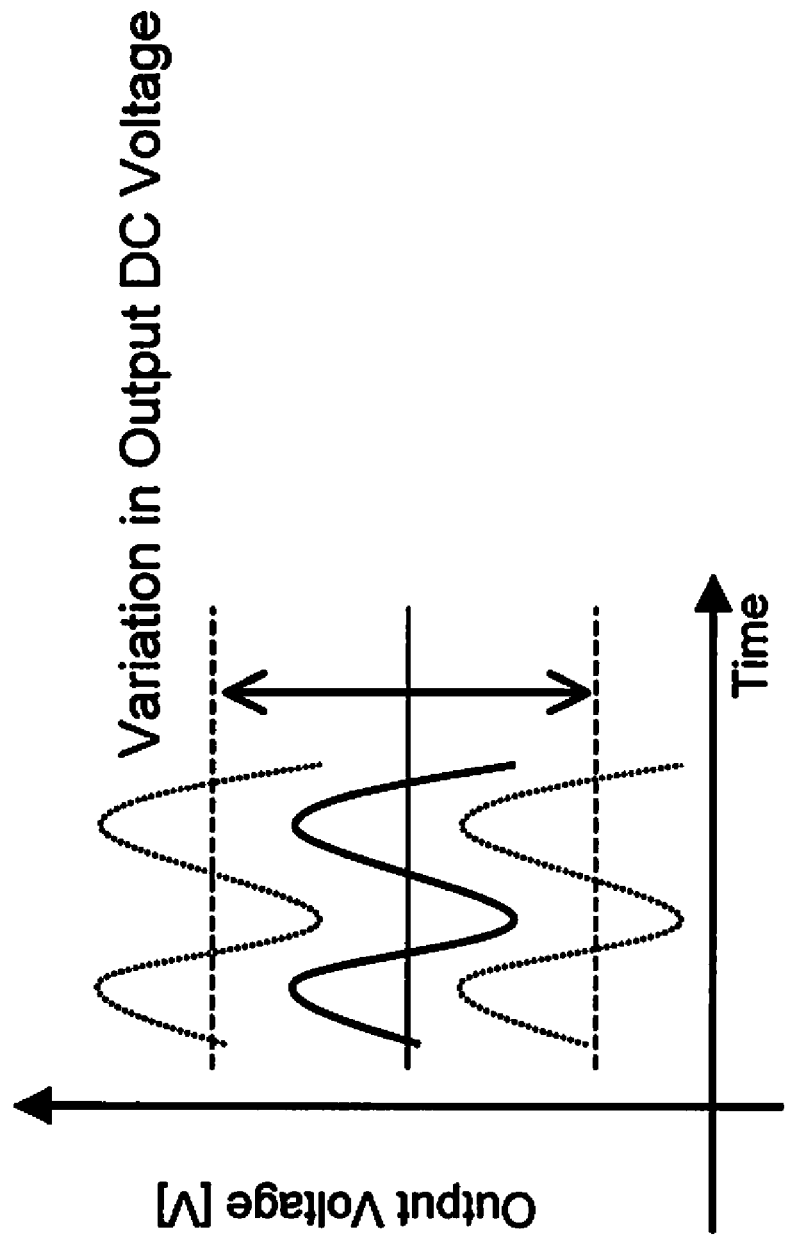
FIG. 7 depicts a graph of variation in an output voltage.

Next, a fourth embodiment will be described. The fourth embodiment is an example in which a mixer circuit 40 that mixes at least two signals (RF and LO) is provided in place of the amplifier circuit 10. FIG. 4 depicts an example of the semiconductor device 1 including the mixer circuit 40.

The mixer circuit 40 includes resistors 41 to 44 having the resistance value R, and transistors Tr40 to Tr45.

The gate of the transistor Tr40 is connected to the Gm compensation bias circuit 20, and the drain thereof is connected to the sources of the transistors Tr41, Tr42. Similarly, the gate of the transistor Tr43 is connected to the Gm compensation bias circuit 20, and the drain thereof is connected to the sources of the transistors Tr44, Tr45. A biased drain current Igm flows respectively into the transistors Tr40, Tr43 such that the respective transconductance Gm are inversely proportionate to the resistance value R of the resistors 41 to 44.

Further, the stabilization bias circuit 30 has two connection lines, which are connected between the transistor Tr40 and the transistors Tr41, Tr42 and between the transistor Tr43 and the transistors Tr44, Tr45, respectively.

Since the stabilization bias circuit 30 has two output connection lines, the number of transistors Tr21 to Tr23 and Tr24 to Tr26 is increased proportionately in comparison with the second embodiment and so on. The differential current (Igm−Ir) is output from each connection line, similarly to the second embodiment and so on. Hence, both gain stability and output voltage stability are established in the amplifier circuit 10, similarly to the first embodiment and so on.

Further, in the mixer circuit 40, the connection lines of the stabilization bias circuit 30 are connected between the transistors Tr40, Tr41 (or the transistors Tr43, Tr44). Hence, in the fourth embodiment, similarly to the third embodiment, the effect of parasitic capacitance in the connection line on the characteristic of the mixer circuit 40 can be reduced.

Note that the mixer circuit 40 may be implemented on either one of the transistor Tr40 to Tr42 side or the transistor Tr43 to Tr45 side. In this case, a single connection line is provided from the stabilization bias circuit 30.

The first to fourth embodiments were described above. Next, examples of simulation results will be described. FIG. 5A and FIG. 5B depict these examples. FIG. 5A depicts an example in which the stabilization bias circuit 30 is not provided, and FIG. 5B depicts an example of simulation results obtained in the fourth embodiment (FIG. 4). Output direct current voltage results under so-called corner conditions, in which manufacturing conditions, temperature conditions, the power supply voltage, and so on are set at various values, are depicted.

When the stabilization bias circuit 30 is not provided, as depicted in FIG. 5A, the output current voltage of the amplifier circuit 10 varies greatly between a [minimum value] of "0.27 [V]" and a [maximum value] of "1.69 [V]" in relation to a TYP (standard value) of "0.64 [V]".

On the other hand, when the stabilization bias circuit 30 is provided, as depicted in FIG. 5B, variation in the output direct current voltage is small under all conditions.

It is clear from these simulation results that even when the gain of the amplifier circuit 10 is made constant by the Gm compensation bias circuit 20, the output direct current voltage is stabilized by the differential current output by the stabilization bias circuit 30.

In the first to fourth embodiments, examples, in which the output voltage bias circuit 20 is connected to the amplifier circuit 10 or the mixer circuit 40, are described, but the output voltage bias circuit 20 may be connected to a buffer circuit having a resistor and a transistor, for example. Further, an attenuating circuit that attenuates and then outputs a signal may be connected to the output voltage bias circuit 20 in place of the amplifier circuit 10.

According to the present invention, a semiconductor device with which variation in an output direct current voltage of an amplifier circuit is small, even when a Gm compensation bias voltage is applied to compensate for the gain of the amplifier circuit, such that a favorable output signal distortion characteristic is obtained, can be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device comprising:

a gain control circuit;

a first circuit a gain of which is controlled to be constant by the gain control circuit; and a bias circuit connected to the first circuit, wherein the first circuit including a first transistor; and a load resistance, an amplification factor or an attenuation factor of the first circuit is proportionate to a product of a transconductance of the first transistor and a resistance value of the load resistance, and a voltage applied to the load resistance is set as an output of the semiconductor device, the bias circuit generates and outputs a differential current of a current that is proportionate to a drain current flowing into the first transistor and a current that is inversely proportionate to the load resistance value, and an output of the bias circuit is connected to an output node of the first circuit.

2. The semiconductor device according to claim 1, wherein the bias circuit including:

second and third transistors which are controlled by the gain control circuit respectively;

first and second current sources which are connected respectively to drains of the second and third transistors in order to output a current that is inversely proportionate to the load resistance value;

a first current mirror circuit connected between the second transistor and the first current source; and a second current mirror circuit connected between the third transistor and the second current source, and respective outputs of the first current mirror circuit and the second current mirror circuit are connected by a first connection node such that the differential current is output from the first connection node.

3. The semiconductor device according claim 1, wherein the bias circuit including:

second and third transistors which are controlled by the gain control circuit respectively;

first and second current sources which are connected respectively to drains of the second and third transistors in order to output a current that is inversely proportionate to the load resistance value;

a first current mirror circuit connected to a first connection node between the second transistor and the first current source;

a second current mirror circuit connected to a second connection node between the third transistor and the second current source;

a first operation amplifier which compares a voltage of the first connection node and a gate voltage of the second transistor and controls a gate of the first current mirror circuit; and a second operation amplifier which compares a voltage of the second connection node and a gate voltage of the third transistor and controls a gate of the second current mirror circuit, and respective outputs of the first current mirror circuit and the second current mirror circuit are connected by a third connection node such that the differential current is output from the third connection node.

4. A semiconductor device comprising:

a gain control circuit;

a first circuit a gain of which is controlled to be constant by the gain control circuit; and a bias circuit connected to the first circuit, wherein the first circuit including first and second transistors; and a load resistance, an amplification factor or an attenuation factor of the first circuit is proportionate to a product of a transconductance of the first transistor and a resistance value of the load resistance, the second transistor is connected in cascade form to the first transistor, and a voltage applied to the load resistance is set as an output of the semiconductor device, the bias circuit generates and outputs a differential current of a current that is proportionate to a drain current flowing into the first transistor and a current that is inversely proportionate to the load resistance value, and an output of the bias circuit is connected between the first transistor and the second transistor.

5. A semiconductor device comprising:

a gain control circuit;

a first circuit a gain of which is controlled to be constant by the gain control circuit; and a bias circuit connected to the first circuit, wherein the first circuit including a first transistor which inputs a first signal; second and third transistors which respectively input a differential signal, and first and second load resistances, a drain of the first transistor is connected to respective sources of the second and third transistors, an amplification factor or an attenuation factor of the first circuit is proportionate to a product of a transconductance of the first transistor and a resistance value of the first and second load resistances, and a voltage applied to an output of the first load resistance or the second load resistance is set as an output of the semiconductor device, the bias circuit generates and outputs a differential current of a current that is proportionate to a drain current flowing into the first transistor and a current that is inversely proportionate to the load resistance value, and an output of the bias circuit is connected among the first transistor, the second transistor, and the third transistor.

* * * * *